US008822346B1

(12) United States Patent
Weiner

(10) Patent No.: US 8,822,346 B1
(45) Date of Patent: Sep. 2, 2014

(54) METHOD AND APPARATUS FOR SELF-ALIGNED LAYER REMOVAL

(75) Inventor: Kurt Weiner, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 886 days.

(21) Appl. No.: 12/136,184

(22) Filed: Jun. 10, 2008

(51) Int. Cl.
*H01L 21/302* (2006.01)
*H01L 21/461* (2006.01)
*B44C 1/22* (2006.01)
*C03C 15/00* (2006.01)
*C03C 25/68* (2006.01)
*C25F 3/00* (2006.01)

(52) U.S. Cl.
USPC ........... 438/745; 438/689; 438/704; 438/749; 438/750; 438/753; 438/754; 438/756; 438/757; 216/22; 216/83; 216/96

(58) Field of Classification Search
None
See application file for complete search history.

(56) References Cited

U.S. PATENT DOCUMENTS

2005/0095844 A1* 5/2005 Saito et al. .............. 438/630
2007/0082508 A1* 4/2007 Chiang et al. .............. 438/800

* cited by examiner

*Primary Examiner* — Nadine Norton
*Assistant Examiner* — Stephanie Duclair

(57) ABSTRACT

A reaction block having a plurality of reaction chambers defined therein is provided. A bottom surface of each of the reaction chambers is configured to provide a seal for a corresponding reaction region on the substrate and around a periphery of the substrate. The reaction block includes a plurality of inlet channels and provides a gap between a top surface of the substrate and a bottom surface of the reaction block. The gap accepts a fluid from the inlet channels, wherein the reaction block includes a plurality of vacuum channels having access to the bottom surface of the reaction block to remove the fluid from the gap. A method of selectively etching a substrate for combinatorial processing is also provided.

17 Claims, 8 Drawing Sheets

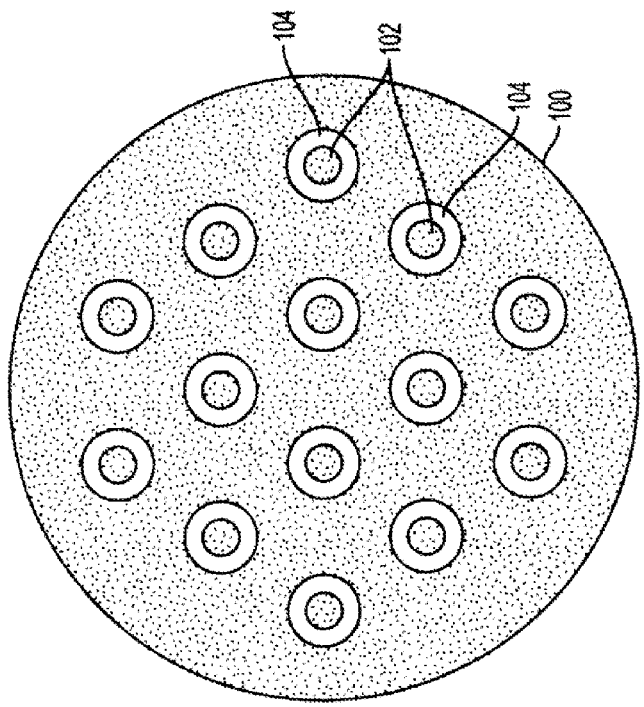
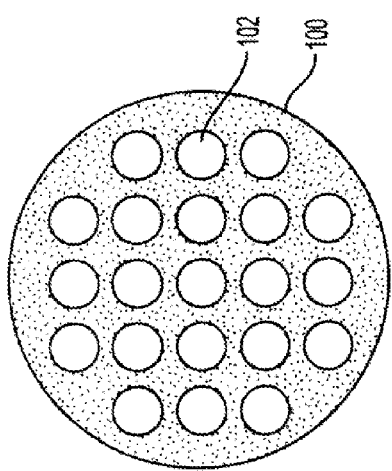
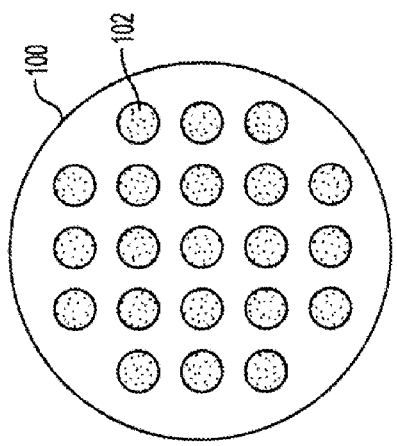

METHOD AND APPARATUS FOR SELF-ALIGNED LAYER REMOVAL

BACKGROUND

Combinatorial processing enables rapid evaluation of semiconductor processing operations. The systems supporting the combinatorial processing are flexible to accommodate the demands for running the different processes either in parallel, serial or some combination of the two.

Some exemplary semiconductor processing operations includes operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the semiconductor processing operations. However, semiconductor companies typically conduct R&D on full wafers through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

An improved technique for accommodating gathering of additional data for multiple process variations on a single substrate is provided to enhance the evaluation of the viability of different materials, unit processes, or process sequences.

BRIEF DESCRIPTION OF THE DRAWINGS

The present invention will be readily understood by the following detailed description in conjunction with the accompanying drawings, and like reference numerals designate like structural elements.

FIGS. 1A through 1C provide simplified schematics illustrating exemplary etch patterns to be applied to substrates in accordance with one embodiment of the invention.

DETAILED DESCRIPTION

Figure 2:
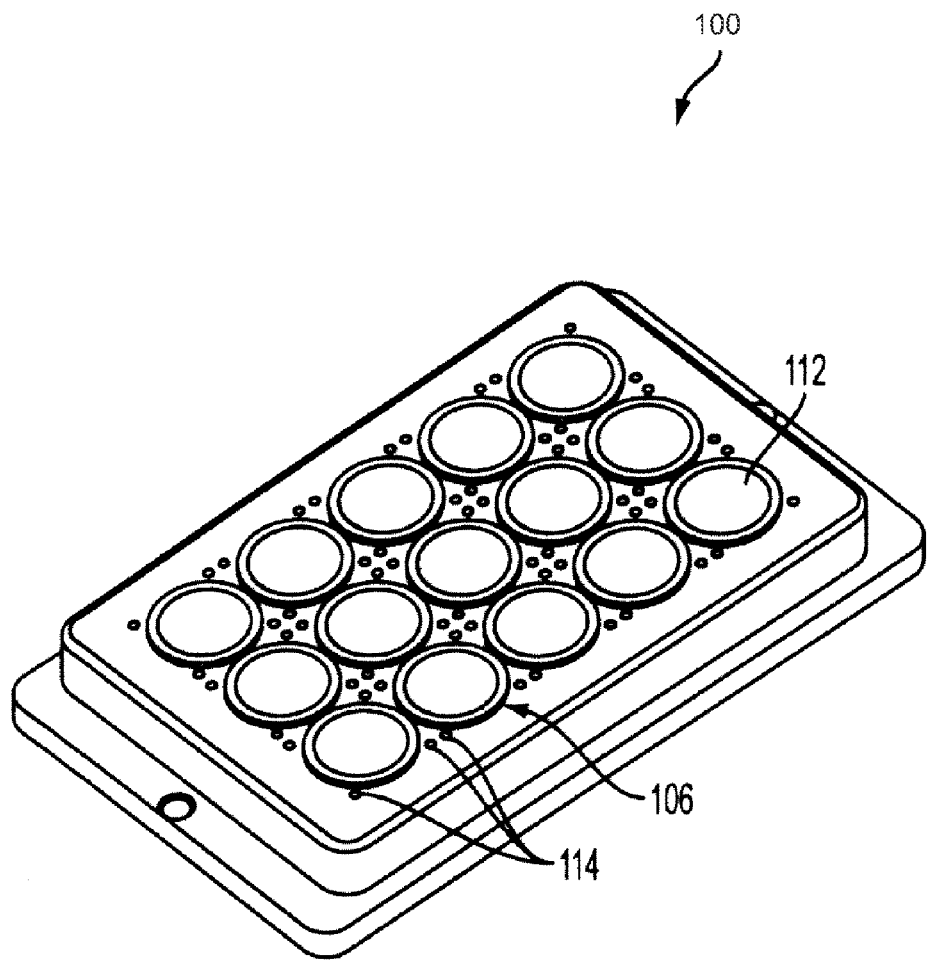
FIG. 2 is a simplified schematic diagram illustrating a bottom view of a reactor block which will seal against a substrate, such as the substrates described above with regard to FIGS. 1A-1C.

The embodiments described herein provide a method and apparatus for removal of films in a self aligned manner during combinatorial processing of semiconductor processing operations. It will be apparent to one skilled in the art that the present invention may be practiced without some or all of these specific details. In other instances, well known process operations have not been described in detail in order not to unnecessarily obscure the present invention.

According to various embodiments described herein, a substrate is divided into multiple regions by isolating individual regions on the substrate. The isolation may be performed using, for example, a reactor block that includes multiple reactors and that is placed over a substrate. One or more of the reactors includes a seal that contacts the substrate to isolate the reactors from each other and to keep fluids deposited in the reactors within the reactors. Using this or a similar device, fluids can be deposited either within (internal to) or outside of (external to) the reactors to etch or otherwise react with the substrate in a patterned manner.

Combinatorial Processing Overview

The embodiments described herein enable the application of combinatorial techniques for process sequence integration of semiconductor manufacturing operations. Combinatorial processing applied to semiconductor manufacturing operations assists in arriving at a globally optimal sequence of semiconductor manufacturing operations by considering interaction effects between the unit manufacturing operations, the process sequence of the unit manufacturing operations, the process conditions used to effect such unit manufacturing operations, as well as materials characteristics of components utilized within the unit manufacturing operations. The embodiments described below provide details for a multi-region processing system and associated reaction chambers that enable processing a substrate in a combinatorial fashion. In one embodiment, the different regions are isolated (e.g., 'site-isolated') so that there is no interdiffusion between the different regions.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequences used to build that portion of the device or structure. According to some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create a structure found on semiconductor chips.

While the combinatorial processing varies certain materials, unit processes, or process sequences, the composition or thickness of the layers or structures, or the action of the unit process is substantially uniform for each region. It should be noted that the process can be varied between regions, for example, a thickness of a layer is varied or one of various process parameters, such as a voltage, may be varied between regions, etc., as desired by the design of the experiment. The result is a series of regions on the substrate that contains structures or unit process sequences that have been uniformly applied within that region and, as applicable, across different regions. This process uniformity allows comparison of the properties within and across the different regions such that variations and test results are due to the parameter being modified, e.g., materials, unit processes, unit process parameters, or process sequences, and not the lack of process uniformity.

In addition, the combinatorial processing of the substrate may be combined with conventional processing techniques where substantially the entire substrate is processed, e.g., most or all of the regions of the substrate are subjected to the same materials, unit processes, and process sequences. Thus, the embodiments described herein can pull a substrate from a manufacturing process flow, perform combinatorial processing, and return the substrate to the manufacturing process flow for further processing. Alternatively, a substrate can be processed in an integrated tool that allows both combinatorial and conventional processing in various chambers attached around the central chamber. Consequently, using one substrate, information concerning the varied processes and interaction of the varied processes with conventional processes can be evaluated. Accordingly, a multitude of data is available from a single substrate for desired processes.

The embodiments described herein provide for film removal in a self-aligned manner relative to a site-isolated reactor pattern. In one embodiment, a blanket film, such as a seed layer, disposed over a substrate is immersed in an appropriate etchant and the reaction regions defined by the site-isolated reactors are sealed to avoid reaction with the etchant. In this embodiment, the etchant will remove material from around the site-isolated reactors. In another embodiment, the etchant may be placed within the individual site-isolated reactors and the film within the site-isolated reactors may be removed. The embodiments achieve the self-aligned film removal by providing a seal i.e., a barrier, between processed and non-processed regions that is a barrier to the etchant. That is, the etchant is contained either within a reaction region or outside a reaction region through a seal with the substrate provided by each site-isolated reactor. This seal may be a teflon lip seal, an o-ring seal, etc. Further details on the type of seal are provided in FIG. 4.

It should be appreciated that where the regions between the site-isolated reactors are etched, in order to facilitate the etching and to provide for the removal of the etchant a peripheral seal may be provided at the substrate circumference or periphery. This seal around the edge or periphery of the substrate may simply be a lip-type seal, i.e., a raised lip or an o-ring, or other seal to contain the etchant on the substrate, or an insert as described further below.

Seed Layer and Protective Film

In one embodiment, the techniques described herein may be used where a thin blanket conductive seed layer (e.g., a blanket copper seed layer) has been deposited over the entire substrate. The blanket layer can be a conductive seed layer that can be used to perform combinatorial processes that are electrical (e.g., electrochemical plating). In these embodiments, in order to electrically isolate each reactor or reactor region, the blanket conductive seed layer is removed from intermediate regions between reactors. In other embodiments, the conductive seed layer can be removed from within the reactors.

Another application for the embodiments described herein is for use with a film that protects the wafer surface from exposure to contamination during the transportation of wafers from a site that is not co-located with the site-isolated tool or combinatorial processing. In this embodiment, a protective film, for example, photoresist (a soft mask), an oxide (a hard mask), or a metal layer, can be applied at a remote site to protect the substrate during transportation. It should be appreciated that the substrate may have experienced some semiconductor manufacturing operations and the substrate will be further processed through combinatorial processing operations. The film can be selectively removed from processed regions at the location of the site-isolated reactor or combinatorial processing manufacturing facility. In addition, the embodiments may be used to facilitate re-insertion of the wafer into a process line after processing in a site-isolated reactor.

It should be appreciated that when making contact with the wafer surface, there is the potential to leave contaminants on the wafer surface that may inhibit or prohibit further processing of the wafer. However, if a sacrificial protective film is deposited on the wafer prior to the site-isolated processing, the contact made for site-isolated processing is with the sacrificial layer. Therefore, prior to processing in a conventional processing chamber, the sacrificial layer may be selectively removed. Thus, contact at the site-isolated processing facility is only made with the sacrificial layer, which is eventually removed, so that contaminants left from the site-isolated processing are removed with the sacrificial layer. In addition, it should be appreciated that the embodiments described herein utilize the site-isolation pattern and etching capabilities intrinsic to a site-isolated wet process tool to eliminate the need for a lithography step when investigating processes that require isolation of a blanket thin film.

Exemplary Etch Patterns (External, Internal, and Annular Regions)

FIGS. 1A through 1C provide simplified schematics illustrating exemplary etch patterns to be applied to substrates in accordance with one embodiment of the invention. It should be appreciated that substrate 100 of FIGS. 1A through 1C may be a blanket substrate with a thin copper layer disposed thereon in one embodiment. However, the embodiments are not limited to this structure as any suitable substrate which may be utilized in semiconductor manufacturing operations may be provided. For example, substrates including blanket dielectric or other protective layers (as described above), or patterned or otherwise non-uniform surfaces may also be used with embodiments of the invention.

In FIG. 1A, the etchant is provided inside the reactors in order to define reaction regions 102. Substrate 100 may have a protective coating, e.g., a photoresist, in one embodiment. Portions of the protective coating are removed through the techniques described herein in order to define reaction regions 102 on substrate 100. Reaction regions 102 are, in one embodiment, reaction regions of the substrate 100 that are processed in a combinatorial manner. In other embodiments, the substrate 100 can have any blanket layer, such as a conductive seed layer, a passivation layer, a barrier layer, etc.

As mentioned above, the protective coating may or may not be disposed over a seed layer. Accordingly, in FIG. 1A, the protective coating is removed from reaction regions 102, and remains disposed over the rest of the surface of substrate 100. Using these techniques, e.g., where the blanket layer is a conductive seed layer and the protective layer is disposed thereover, electricity can be provided to all of the reaction regions 102 by applying a potential to one of the regions 102, while the areas outside of the reaction regions 102 remain non-conductive. In one embodiment, an etchant may be applied through a reactor block having openings coinciding with reaction regions 102 as described in more detail with reference to FIGS. 2, 3, 6 and 7.

In FIG. 1B, the etchant is provided outside the reactor regions and removes the coating external to reaction regions 102. Substrate 100 may or may not have a blanket layer such as a copper seed layer defined thereon in FIG. 1B. By providing an etchant and sealing the reaction regions, as described further below, when substrate 100 has a copper seed layer, the copper seed layer is removed outside of reaction regions 102 and remains elsewhere on the surface of substrate 100. Thus, in FIG. 1B, reaction regions 102 are electrically isolated from each other in this manner. Accordingly, substrate 100 of FIG. 1B may be further processed in a combinatorial manner to evaluate post seed layer processing in one embodiment. Upon completion of the combinatorial processing, a protective coating may be applied to the entire surface of substrate 100 and the substrate may be delivered to an offsite location for further conventional semiconductor processing operations upon removal of the protective coating(s).

FIG. 1C illustrates yet another alternative for patterning the blanket substrate through the embodiments described herein. In FIG. 1C, substrate 100 has reaction regions 102 defined thereon and isolated through annular ring 104, as is further described below regarding FIG. 7. Ring 104 is an area where the etchant is applied in order to remove material so that reaction regions 102 are electrically isolated from each other in one embodiment. For example, where substrate 100 has a thin copper seed disposed thereon, each reaction region 102 is electrically isolated from each other reaction region through ring 104, which was etched to remove the copper seed layer. Here, concentric seals encompassing reaction region 102 will contain an etchant introduced therebetween in one embodiment, as illustrated with reference to FIG. 7. In another embodiment, the area of regions 102 is larger than an area that will be exposed to combinatorial processing. In this manner, a probe may contact a surface of region 102 outside of the combinatorial processing area to influence the combinatorial processing, e.g., apply a bias to region 102 during an electrochemical process. It should be appreciated that while FIGS. 1A-C illustrate a circular substrate and reaction regions, the embodiments are not limited to these shapes, as any suitable shape may be used for the substrates and the reaction regions on the substrates.

Reactor Block

FIG. 2 is a simplified schematic diagram illustrating a bottom view of a reactor block 100 which will seal against a substrate, such as the substrates described above with regard to FIGS. 1A-1C. As mentioned above, reactor block 100 is not limited to a quadrilateral shape, as any shape may be utilized, as well as any number and pattern of regions may be defined through reactor block 100. Within reactor block 100 are openings or reaction chambers 112. Around reaction chambers 112 are seals 106 which will isolate a reaction region defined by reaction chambers 112 as reactor block 100 is placed upon a substrate. It should be noted that seals 106 may be integrated into a sleeve disposed inside the reaction chambers 112, affixed to the bottom surface of reactor block 100, or integrated as part of a unitary reactor block.

Figure 6:
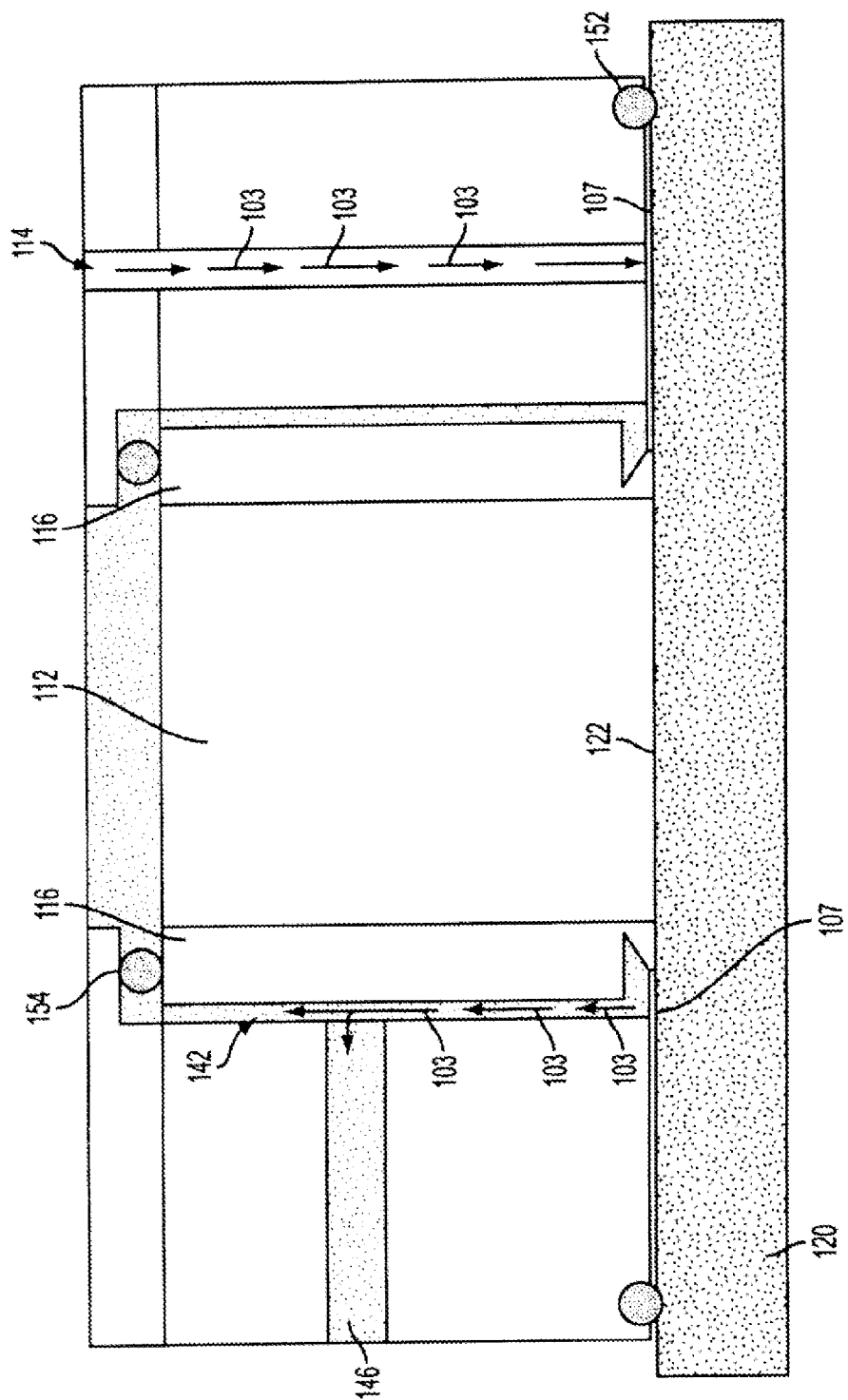
FIG. 6 is a simplified schematic diagram illustrating a cross-sectional view of a reaction chamber in accordance with one embodiment of the invention.

Fluid conduits 114 may be provided through a solid portion of reactor block 100 in order to provide access for an etchant outside of reaction chambers 112 in one embodiment, as is described further regarding FIG. 6. Thus, through fluid conduits 114 a pattern, such as the pattern described in FIG. 1B, can be created. In another embodiment, the etchant may be supplied within a processing area defined by reaction chambers 112 in order to provide the pattern described with regard to FIG. 1A. Flow cells may be used to supply the fluid to the reaction chambers in one embodiment. In another embodiment, the etchant may be dispensed into reaction chambers 112 through an appropriate dispensing mechanism. The dispensing mechanism may be syringe pump that can pierce a septum to distribute the etchant to reaction chambers 112 in one embodiment. For example, a group of syringe pumps can be attached to a robot and moved into the reaction chambers 112.

One skilled in the art will appreciate that the material of construction for reactor block 100 may be any suitable material capable of withstanding the etchant and compatible with the operations described herein. In one embodiment, reactor block 100 may be a polymer, such as poly ether ether ketone (PEEK), a metal, such as aluminum, or a ceramic block, while seals 106 may be a non-reactive or inert material such as TEFLON™, or other suitable materials used for o-rings, etc. In an alternative embodiment, sleeves or inserts may be placed within each of the reaction chambers 112 (also referred to as reactor cells) and the inserts may provide the seal to isolate the reaction region, as described further with reference to FIG. 4. It should be appreciated that reactor block 100 may be a monolithic block in one embodiment. In another embodiment, reactor block 100 may be composed of modular reaction chambers 112 as described in more detail below. In one embodiment, a rail system supports individual reaction chambers 112 or a plurality of reaction chambers, e.g., a row of reaction chambers.

Figure 3:
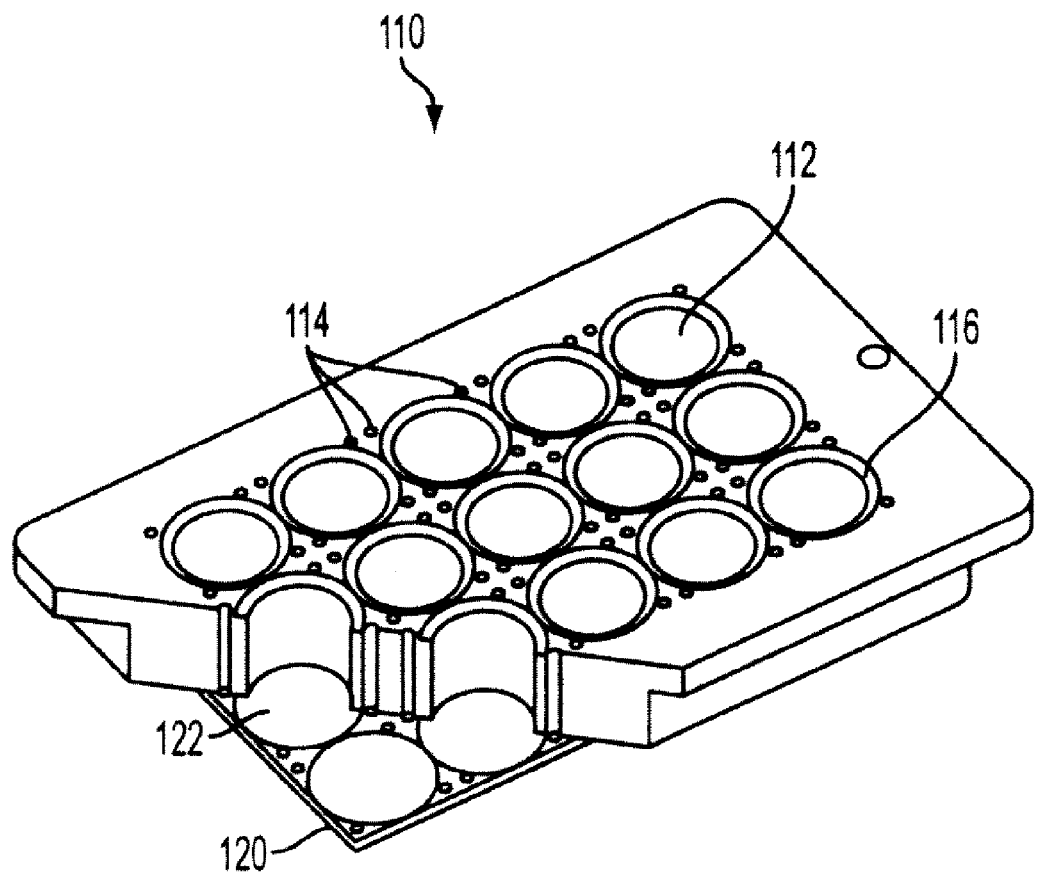
FIG. 3 is a top view of a reactor block in accordance with one embodiment of the invention.

FIG. 3 is a top view of another reactor block 110 in accordance with one embodiment of the invention. Reactor block 110 includes reaction chambers 112 defined therethrough. Sleeves 116 may be provided through an insert disposed within reaction chambers 112. In this embodiment, sleeves 116 provide a seal for a top surface of reactor block 110, as well as a bottom surface of the reactor block. It should be appreciated that the seal for the top surface of reactor block 110 enables reaction chambers 112 to be isolated from an external environment. In one embodiment, the lip or an o-ring disposed on a top of sleeves 116 on the top of the reactor block provides a seal with a flow cell, as is described regarding FIGS. 4 and 5. Alternatively or additionally, seals 106 may be disposed on a bottom surface of reactor block 110 (as shown in FIG. 2), e.g., as o-rings surrounding each of the reaction regions.

Fluid conduits 114 of FIG. 3 provide an etchant around the outside regions of reaction chambers 112. It should be appreciated that sufficient spacing is provided between a bottom surface of reactor block 110 and a top surface of substrate 120 so that the etchant may flow between the two surfaces. This spacing or gap may result from the thickness of seals 106 of FIG. 2 or a height of sleeves 116. Thus, varying gaps may be provided through varying thicknesses of seals 106 or the height of the sleeves 116. Fluid conduits 114 are in fluid communication with a fluid supply that contains an etchant in one embodiment.

Reactor block 110 is disposed over substrate 120. Reaction chambers 112 define reaction regions 122 when disposed on substrate 120 in one embodiment. As mentioned above, reactor block 110 is configured to define reaction regions 122, thus reactor block 110 is self-aligned in nature as the reaction regions 122 are defined by the reactor block 110. The reaction regions 122 may be equivalent to the reaction regions 102 in some embodiments. In another embodiment, reaction region 122 may be pre-defined on substrate 120. In this embodiment, a seal, e.g., such as an o-ring, may be defined around reaction region 122, thereby eliminating the need for providing a seal on a bottom surface of reactor block 110.

Sleeve Sealing

Figure 4:
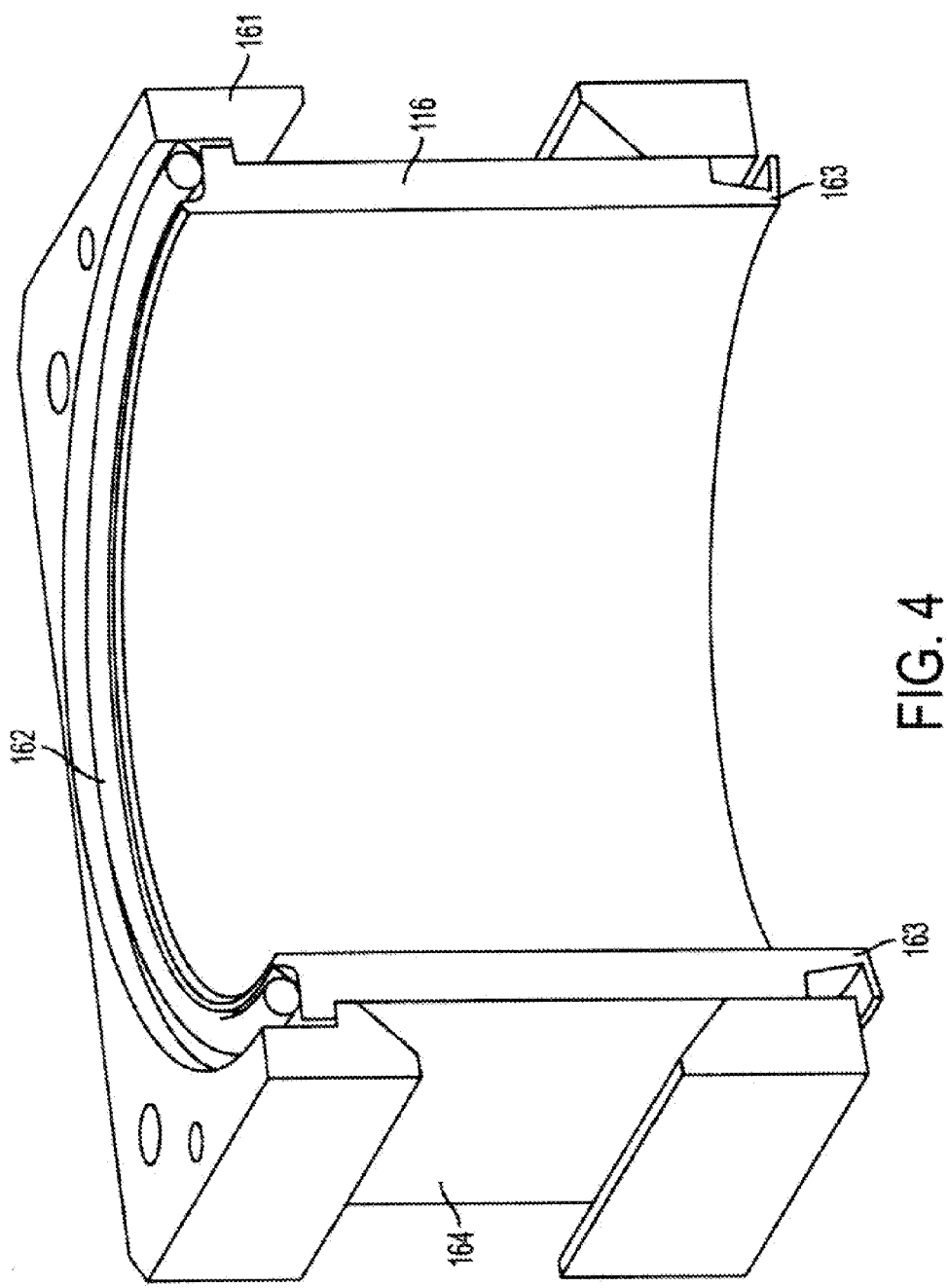
FIG. 4 is a simplified schematic diagram for a sleeve within a reaction chamber that defines a processing region around and below the process module when disposed over a substrate in accordance with one embodiment of the invention.

FIG. 4 is a cross-section of a reaction chamber 112 that shows a sleeve within the reaction chamber and defines a processing region around and below the process module when disposed over a substrate in accordance with one embodiment of the invention. In FIG. 4, a bottom surface 163 of sleeve 116 is designed to seal with a top surface of a substrate and encompass the lower portion of a flow cell that may be inserted into the processing region defined within sleeve 116. The bottom surface 163 of sleeve 116 is compliant in one embodiment and as pressure is applied downward toward the substrate surface, the bottom surface 163 conforms to seal with the substrate surface. O-ring 162 sits on a shoulder defined on a top surface of sleeve 116 and provides an upper seal with a bottom surface of the flow cell. In one embodiment a compliant spring section is provided to allow sleeve 116 to float and provide a sealing force between sleeve 116 and the substrate surface. In this manner, the processing region is isolated from the other regions and an external environment.

In one embodiment, the reaction chamber 112 shown in FIG. 4 is a modular reaction chamber that can be used with other modular reaction chambers to form a modular reactor block. Slots 164 may be provided for rails to support the reaction chambers when the reaction chambers are separate pieces as opposed to a unitary block. Thus, the sleeves and the enclosures are moveable along with the flow cell in order to eliminate the need for a monolithic plate that has a fixed pitch for the location of the reaction regions relative to the surface of the substrate. In one embodiment, sleeve 116 may be formed from polytetrafluoroethylene, while enclosure 161 may be formed from any suitable material capable of supporting sleeve 116. O-ring 162 may be composed of any chemically inert material compatible with the fluids used for processing.

Flow Cell for Wet or Dry Etch

Figure 5:
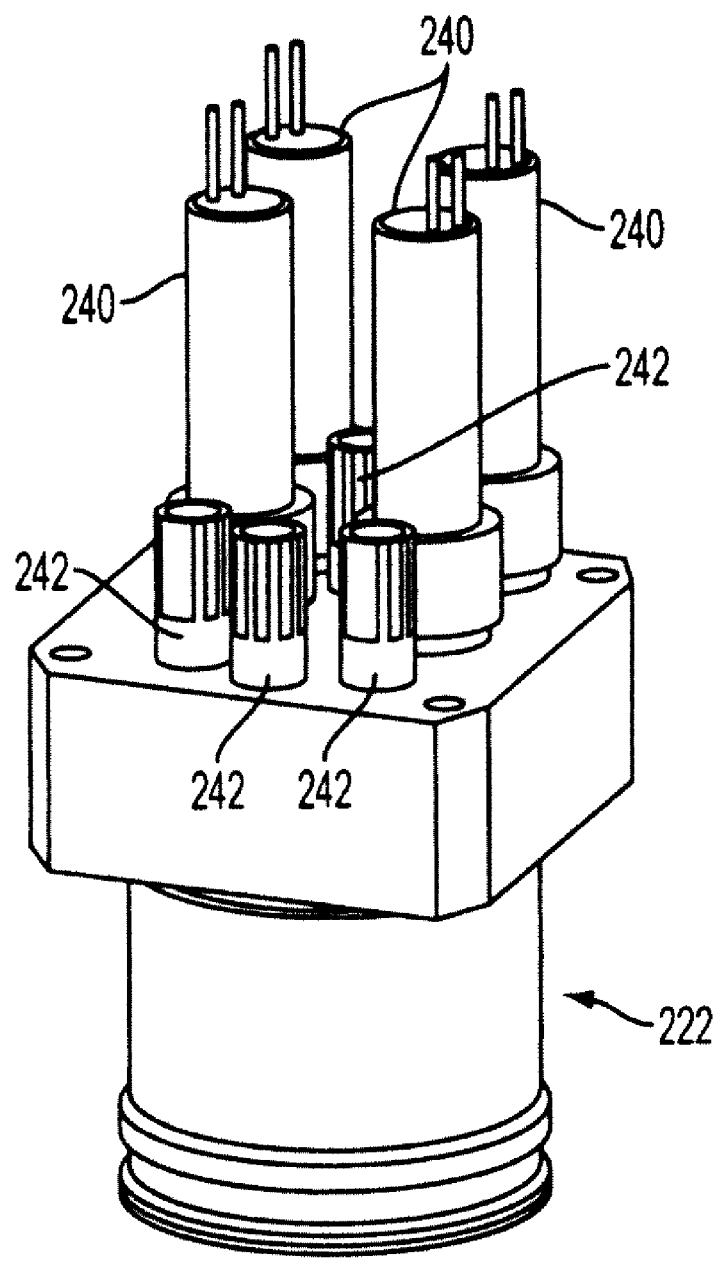
FIG. 5 is a simplified schematic diagram illustrating a flow cell in accordance with one embodiment of the invention.

FIG. 5 is a simplified schematic diagram illustrating a flow cell in accordance with one embodiment of the invention. Flow cell 222 includes valves 240 which are manipulated in order to route flows of fluid delivered through inlets 242. Accordingly, a plurality of fluids may be provided to flow cell 222 and based on the manipulation and channels within flow cell 222 numerous combinations or types of flows may be provided to a reaction region defined under a bottom surface of flow cell 222. In one embodiment, flow cell 222 is inserted into reaction chambers 112 of reactor block 110 of FIGS. 2 and 3, with sleeve 116 of FIG. 4 disposed within the reaction chambers. It should be noted that flow cell 222 may provide radial flow over the reaction region in one embodiment. In addition, flow cell 222 may dispense fluid onto the surface of an underlying reaction region of a substrate, allow the fluid to reside for a time period and then remove the fluid through an evacuation channel (see FIGS. 6 and 7) in flow communication with an evacuation source, such as vacuum.

In one embodiment, flow cell 222 of FIG. 5 is adapted to strike a plasma within the processing area to etch the reaction region to remove a film therefrom. In order to strike a plasma, one skilled in the art will appreciate that a top and/or bottom electrode and a gas inlet is provided to enable a plasma to be struck so that a dry etch process can be performed within the reaction chambers. For example, a plasma gas can be flowed into the reaction chamber, and a potential can be generated between the electrodes sufficient to strike the plasma.

The mini-plasma etch chamber may be a capacitively coupled system or an inductively coupled system in one exemplary embodiment. It should be noted that the materials for the reaction chambers are suitable for a dry plasma process, as opposed to materials mentioned for wet plasma processing. In one embodiment, the materials employed for the dry plasma processing embodiments are materials commonly used for etch chambers performing conventional full wafer processing. It should be appreciated that numerous types of flow cells may be provided for the embodiments described herein in that the flow cell type is not meant to be restrictive as flow cell 222 is one exemplary type of flow cell.

In addition, the embodiments described herein may utilize a delivery arm (e.g., a robot) to dispense fluid to the reaction chamber in place of a flow cell. In order to maintain environmental control the reaction chamber may include a septum which is pierced by the dispenser attached to the delivery arm to dispense the etchant into the processing region. In one embodiment, a dispensing needle will pierce the septum and a pumping mechanism, such as a syringe pump will meter an amount of etchant into the reaction chamber.

Embodiment for Etching External to Reactor

FIG. 6 is a simplified schematic diagram illustrating a cross-sectional view of a reaction chamber in accordance with one embodiment of the invention. The embodiment described regarding FIG. 6 can be used to etch the portions of the substrate 120 external to the reaction regions. Reaction chamber 112 is disposed within the reactor block and defines a reaction region 122 on a surface of substrate 120. It should be appreciated that multiple reaction chambers may be defined within the reactor block in one embodiment as illustrated in FIGS. 2 and 3. Sleeve 116, defines the boundaries of reaction region 122 on the surface of substrate 120. O-ring 152 may be provided to seal an edge or periphery of substrate 120 in order to contain the etchant when it is dispensed outside of reaction chambers 112. Fluid conduit 114 is provided as a fluid channel enabling access onto a surface of substrate 120 defined outside of reaction chambers 112. As illustrated, a small gap exists between the bottom surface of the reactor block and the top surface of substrate 120 in order for the etchant to flow over the surface of substrate 120 external to reaction chambers 112. Sufficient spacing between the support block and the wafer surface is provided to ensure that air bubbles or height non-uniformity do not impact the completeness of the film removal. In one embodiment the gap is about 2 mm.

Vacuum plenum 142 is provided in order to evacuate or remove etchant from the surface of substrate 120, external to reaction chamber 112. Vacuum plenum 142 is a void surrounding sleeve 116 that can be used to transport fluids. In one embodiment, vacuum channel 146 is used to connect various vacuum plenums within the reactor block. The substrate can be etched using the fluid flow path that is illustrated by arrows 103, i.e., the fluid (e.g., etchant) flows in through fluid conduits 114, through gap 107 and out through vacuum plenum 142. One skilled in the art will appreciate that gap 107 may be adjusted by varying a height of sleeves 116 or a thickness of the o-rings providing a seal between the bottom surface of the reactor block and a top surface of the substrate.

Etch Internal Area of Reactor

It should be further appreciated that reaction chambers 112 may have a channel or inlet defined through a top surface or opening of the reactor block, in order to provide etchant into the internal area of reaction chambers 112. This same channel can also be attached to a vacuum source to provide vacuum for etchant removal from the internal area of the reaction chamber 112 with appropriate switches, valves or connections. In one embodiment, a flow cell may provide processing material to the internal area of reaction chamber 112. The material provided to the internal area of reaction chamber 112 may be utilized for combinatorial processing of the reaction region 122. Optional o-ring 154 provides a seal in order to make the reaction area defined within reaction chambers 112 airtight, which enables maintaining a controlled environment within the reaction area.

Deposit Layer-Selectively Remove Part of Layer-Process-Remove Remaining Layer with Unwanted Particles It should be appreciated that where a protective coating has been disposed on the surface of substrate 120, the seal provided by a bottom portion of sleeve 116 contacts the protective coating and not the actual surface of the layer which is being removed. Therefore, the seal will not leave any material on the semiconductor surface of substrate 120 for further processing. That is, the protective coating on which the bottom sealing portion of sleeve 116 rests will collect any particle shed from the bottom sealing portion of the sleeve. The protective coating can then be removed after the processing is performed. In this manner, the removal of the remainder of the protective coating will remove any particulates or contamination. In addition, it should be appreciated that the protective coating is removed inside the reactors for processing within the reactors. However, the protective coating external to the reactors remains intact. Accordingly, the remaining protective coating absorbs any processing debris that may be deposited during the processing within the reactors. The protective coating that is external to the reactors can subsequently be removed in a lift-off process to remove the debris captured thereon.

The wet or dry etching is performed so that the portion of the layer under the seal is minimally impacted in one embodiment. That is, the wet chemical etchant and processing conditions may be selected so as to provide an isotropic etch or anisotropic etch, as desired. One skilled in the art will appreciate that the choice of etchants and processing conditions, for both dry and wet etching, as well as the crystalline structure of the material being etched will contribute to the isotropic or anisotropic nature of the resulting etch. Where a protective layer is placed on the substrate and selectively removed to define reaction regions on the substrate, the lift-off of the remaining protective layer after combinatorial processing, as described herein, is impacted by the isotropic or anisotropic nature of the etch. In one embodiment, the etchants and processing conditions may be combinatorially evaluated. It should be appreciated that the material being etched may be a dielectric material, e.g., silicon dioxide, silicon nitride, etc., a conductive metal, e.g., copper, aluminum, etc., or a monolayer, such as a silanol or thiol based self-assembled monolayer.

Embodiment for Etching Annular Region

Figure 7:
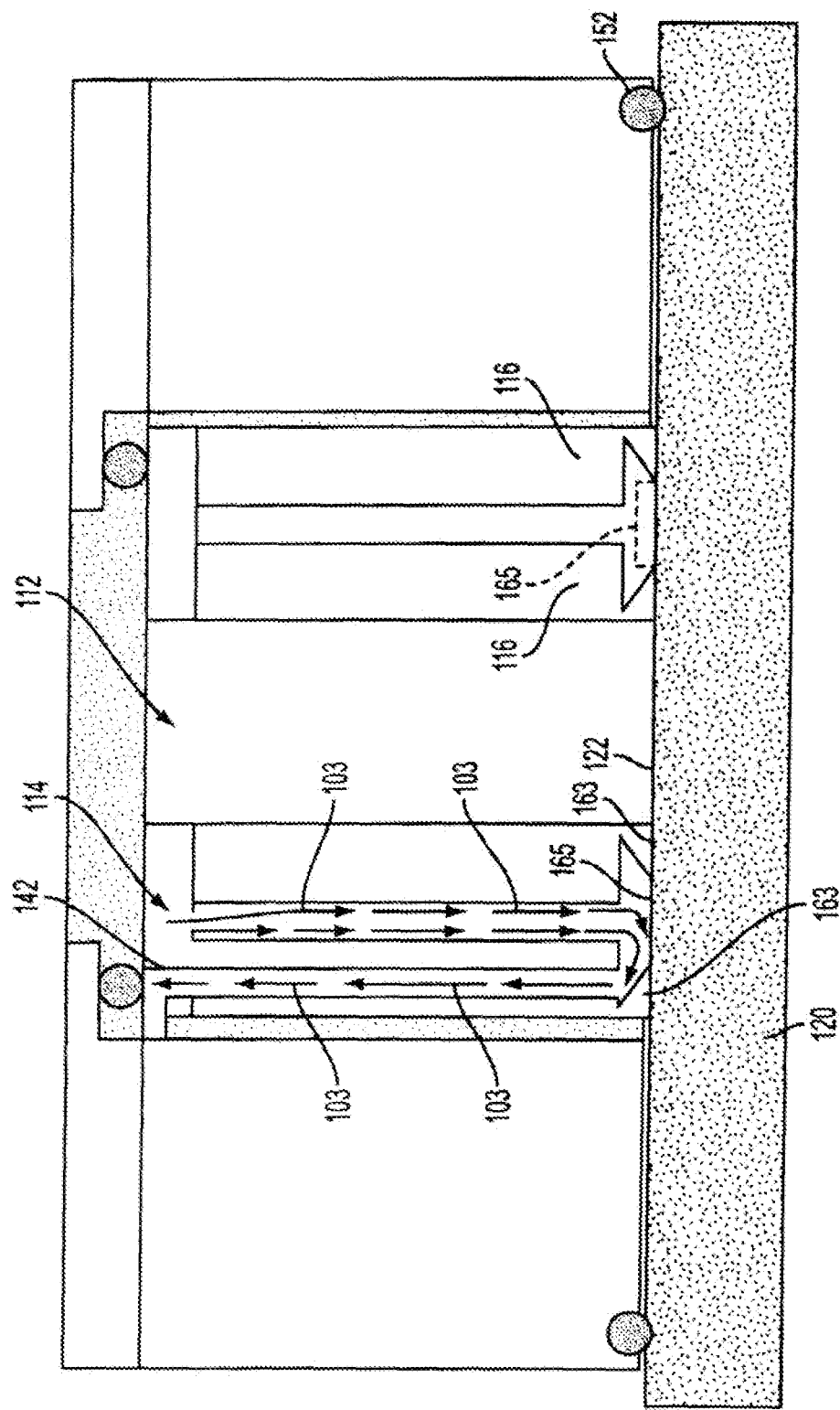
FIG. 7 is a simplified schematic diagram illustrating a cross-sectional view of an alternative embodiment enabling the definition of a ring around a reaction region in accordance with one embodiment of the invention.

FIG. 7 is a simplified schematic diagram illustrating a cross-sectional view of an alternative embodiment enabling the definition of a ring around a reaction region, such as the rings shown in FIG. 1C, in accordance with one embodiment of the invention. Reaction chamber 112 is surrounded by fluid conduit 114 that provides access for an etchant in an area external to reaction chambers 112 and the processing region defined by the reaction chamber. Sleeve 116, which is illustrated as an insert, is used to isolate reaction region 122 on the surface of substrate 120 and define ring isolation region 104. While sleeve 116 is shown as a flexible lip, which seals the chamber from the intermediate area and other regions when downward pressure is applied, it can be implemented by any other known sealing mechanism, such as O-rings. Fluid is provided from an external fluid supply to fluid conduit 114 and will remove material in a ring pattern defined on substrate 120. Fluid is removed through fluid removal channel/vacuum plenum 142 or via fluid conduit 114. Where fluid is removed through removal channel 142, the flow path is depicted by arrows 103. It should be appreciated that when fluid is removed through fluid conduit 114 the flow would be reversed for removal operations.

It should be appreciated that through the embodiments illustrated by FIG. 7, a ring or annular region 165 on a surface of substrate 120, may be defined around reaction region 122 in order to isolate the reaction region from other reaction regions on substrate 120. It should be appreciated that annular region 165 is a cross sectional view of ring 104 of FIG. 1C. In one embodiment, the isolation of conductive regions is achieved through the reaction chamber configuration of FIG. 7 by etching an annular region 165 of a conductive layer on a substrate. In another embodiment, an annular region 165 of a layer that is hydrophilic can be etched away so that an aqueous solution can be subsequently applied to the isolated remaining hydrophilic regions without the reactors. In one embodiment, the annular region 165 encompasses a reaction region that is larger than the actual processing area so that a probe or contact within reaction chambers 112 or sleeve 116, may contact a surface of substrate 120. This probe can then provide electrical monitoring or supply power in order to manipulate an electroprocessing reaction on reaction region 122, such as electroplating. As illustrated in FIG. 7, the bottom surface 163 of sleeves 116 provides a seal for an inner edge of annular region 165 and an outer edge of the annular region. Sleeve 116 may be two separate seals or a single integrated seal. Vacuum plenum 142 is a channel defined within sleeve 116 in one embodiment. As mentioned herein, a probe or contact may be provided through the inner portion of sleeve 116 to provide a conductive pathway to influence an electrochemical reaction.

Method for Etching Substrate to Obtain Etch Patterns of FIGS. 1A-1C

Figure 8:
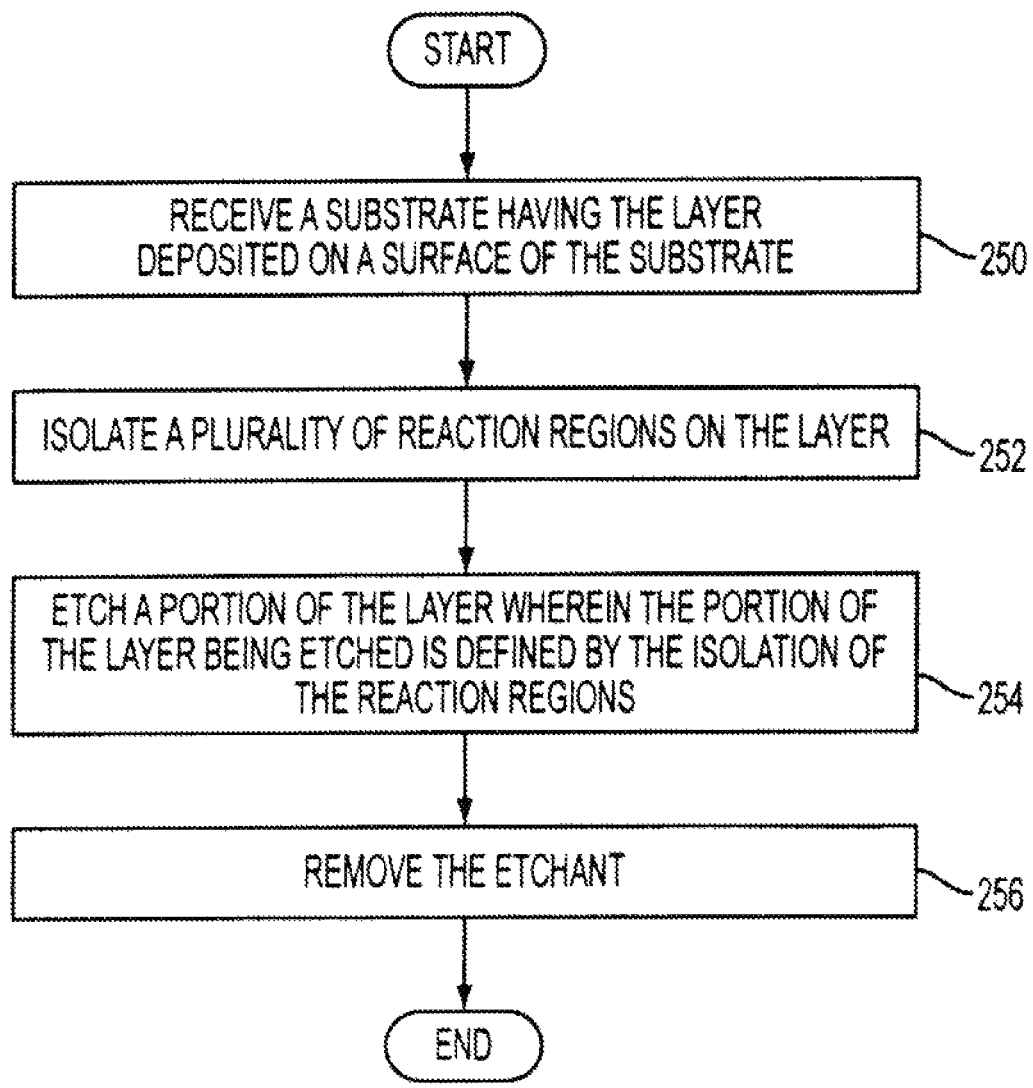
FIG. 8 is a flow chart diagram illustrating the method operations for selectively removing a portion of a layer from a substrate to enable combinatorial processing in accordance with one embodiment of the invention.

FIG. 8 is a flow chart diagram illustrating the method operations for selectively removing a portion of a layer from a substrate to enable combinatorial processing in accordance with one embodiment of the invention. The method initiates with operation 250 where a substrate having a layer deposited on a surface of the substrate is received. As discussed above, the substrate may have a protective layer disposed thereon as a fabrication facility may have deposited the protective layer for shipping to a facility where combinatorial processing will occur as described herein. In another embodiment, the substrate can have a blanket seed layer, such as a copper seed layer. The method then proceeds to operation 252 where a plurality of reaction regions on the layer are isolated. It should be appreciated that the plurality of reaction regions may be isolated through the processing block described above and sealed by a suitable mechanism.

The method then advances to operation 254 where a portion of the layer of the substrate is etched and that portion of the layer being etched is defined by the reaction regions. In this operation, the portion of the layer may be outside the reaction regions (external to the reaction chambers), inside the reaction regions (internal to the reaction chamber), or a ring or annulus surrounding the reaction regions as described above with reference to FIGS. 1A-1C. It should be appreciated that for some embodiments where the portion of the layer is outside the reaction regions, the outer periphery of the substrate is sealed with the reactor block so as to contain the etchant. In the embodiment where a ring or annular region encompassing the respective reaction regions is etched, inner and outer edges of a gap defined on the substrate around each of the reaction regions are sealed. An etchant from a fluid supply in fluid communication with an inlet channel is introduced into the gap and the annular ring area is etched. Exemplary etchants include etchants utilized for etching photoresists, e.g., hydrofluoric acid (HF), metal oxides, e.g., buffered oxide etch (BOE) solutions, or other metals. The method then advances to operation 256 where the etchant is removed. In one embodiment, the etchant is removed through an outlet in fluid communication with a vacuum source.

The substrate may then be processed through combinatorial processing techniques and screened for certain characteristics and/or returned to the fabrication facility for further conventional semiconductor processing and evaluation. As mentioned above, the combinatorial processing may be utilized to perform variations of processing across regions. For example, different processing parameters, processing sequences or materials may be varied across the regions with regard to an electrochemical process in one embodiment. The results of the processing are then characterized and evaluated to ultimately determine an optimal combination of processing parameters, processing sequences or materials or processing parameters, processing sequences or materials that warrant further evaluation through additional combinatorial processing.

Exemplary Application for Copper Seed Layer

The embodiments described herein utilize the site-isolation pattern and etching capabilities used to eliminate the need for a lithography step when investigating processes that require gross isolation of an otherwise blanket thin film. One exemplary application for the embodiments described above is electroplating where a thin blanket copper seed is deposited over the entire wafer. In order to electrically isolate each reactor, the copper seed film must be removed from the intermediate areas between reactors. Thus, the annular regions as illustrated in FIG. 1C may be defined through the reactor block of FIG. 7, thereby electrically isolating the reaction regions of the substrate.

Exemplary Application for Protective Film

Another use for the embodiments is to provide a means to passivate the thin film or protect the film from exposure to contamination or oxygen during the transport of wafers from a site that is not co-located with the site-isolated tool. In such a case, the protective film can be applied at the remote site and then be selectively removed from the process regions at the location of the site-isolated reactor. The embodiments also facilitate re-insertion of the wafer into a process line after processing in a site-isolated reactor that makes physical contact with the wafer surface due to the coating. When physical contact is made, there is the potential to leave contaminants on the wafer surface that would prohibit further processing of the wafer. However, if a sacrificial film is deposited on the wafer surface prior to site-isolated processing, the contact is made to the sacrificial layer. Prior to processing, the sacrificial layer is selectively removed to achieve processing in the site isolated regions, but the layer remains under the seal. Subsequent to processing and prior to re-introduction into the fabrication facility, the sacrificial layer is removed, providing a contamination-free surface.

An alternative implementation of the embodiments provides an integrated reactor sleeve that supplies primary containment for the reactor and incorporates a secondary ring where the etch can take place. In this embodiment, isolation between reactor regions is achieved through a narrow ring where the film is removed, rather than removal of the film from the entire intermediate region.

Any of the operations described herein that form part of the invention are useful machine operations. The invention also relates to a device or an apparatus for performing these operations. The software or control mechanisms can be specially constructed for the required purpose, or can be controlled by a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for electrically isolating reaction regions for combinatorial processing of a substrate, comprising:
   providing a layer on a substrate;
   defining at least one reaction region on a surface of the substrate, wherein the at least one reaction region comprises an inner edge around a periphery of the at least one reaction region and an outer edge, wherein the outer edge encloses the inner edge without enclosing any other reaction region;
   sealing the inner edge of the at least one reaction region;
   sealing the outer edge of the at least one reaction region wherein sealing the inner edge and the outer edge forms a gap between the inner edge and the outer edge;
   introducing an etchant into the gap to remove the layer from the gap; and
   removing the seals from the inner edge and the outer edge.

2. The method of claim 1, further comprising
   supplying a second etchant to an inside of the at least one reaction region.

3. The method of claim 2, wherein the second etchant etches material from the inside of the at least one reaction region to enable combinatorial processing.

4. The method of claim 1, wherein the layer is a protective layer operable to prevent damage to an underlying layer.

5. The method of claim 1, wherein the layer comprises one of photoresist, a dielectric, a conductive material, a seed layer or a monolayer.

6. The method of claim 1, wherein the introducing of the etchant into the gap results in removal of an annular region of the layer, wherein the annular region isolates one reaction region from an area between reaction regions and from other similarly isolated reaction regions.

7. The method of claim 1, further comprising contacting the at least one reaction region with at least one probe extending from a wall of a reaction chamber.

8. The method of claim 1, wherein the removal of the layer from the gap is self aligned through at least one reaction chamber defining the at least one reaction region.

9. The method of claim 1, wherein the sealing comprises compelling a non-reactive material against the surface of the substrate.

10. The method of claim 1, wherein the removal of the layer from the gap electrically isolates the at least one reaction region.

11. The method of claim 1, further comprising:
rinsing the gap to remove the etchant.

12. The method of claim 1, wherein the layer is a copper seed layer.

13. The method of claim 1, wherein the introducing of the etchant into the gap includes flowing the etchant into a channel of a flow cell disposed in a wall of the reaction chamber defining the at least one reaction region.

14. The method of claim 1, wherein the gap is an annular ring defined around the at least one reaction region.

15. The method of claim 1, wherein the sealing of the inner edge and the outer edge includes forcing a bottom surface of a fluid dispensing head against the surface of the substrate.

16. The method of claim 1, wherein a reaction chamber achieves the isolating, the method further comprising
contacting the at least one reaction region inside the inner edge with a probe extending from a wall of the reaction chamber; and
using the probe to manipulate an electroprocessing reaction on the at least one reaction region.

17. The method of claim 1, further comprising forming a second region around the at least one reaction region.

* * * * *